United States Patent
Yang et al.

(10) Patent No.: US 12,352,796 B2
(45) Date of Patent: Jul. 8, 2025

(54) CIRCUIT, METHOD AND STORAGE MEDIUM FOR CONTROLLING FAILURE OF VEHICLE MCU

(71) Applicant: GUANGZHOU AUTOMOBILE GROUP CO., LTD., Guangdong (CN)

(72) Inventors: Tuchao Yang, Guangdong (CN); Ruifu Lai, Guangdong (CN); Wenqing Chen, Guangdong (CN); Yinggong Mo, Guangdong (CN)

(73) Assignee: GUANGZHOU AUTOMOBILE GROUP CO., LTD., Guangdong (CN)

( * ) Notice: Subject to any disclaimer, the term of this patent is extended or adjusted under 35 U.S.C. 154(b) by 0 days.

(21) Appl. No.: 18/551,545

(22) PCT Filed: Sep. 26, 2022

(86) PCT No.: PCT/CN2022/121322
§ 371 (c)(1),
(2) Date: Sep. 20, 2023

(87) PCT Pub. No.: WO2023/093269
PCT Pub. Date: Jun. 1, 2023

(65) Prior Publication Data
US 2024/0175910 A1    May 30, 2024

(30) Foreign Application Priority Data
Nov. 29, 2021   (CN) .......................... 202111429662.7

(51) Int. Cl.
| | |
|---|---|
| G01R 31/00 | (2006.01) |
| B60R 16/023 | (2006.01) |
| G05F 1/46 | (2006.01) |
| H03K 5/24 | (2006.01) |

(52) U.S. Cl.
CPC ........ *G01R 31/007* (2013.01); *B60R 16/0232* (2013.01); *G05F 1/46* (2013.01); *H03K 5/24* (2013.01)

(58) Field of Classification Search
CPC ..... G01R 31/007; B60R 16/0232; G05F 1/46; H03K 5/24
USPC .................................................. 307/9.1, 10.1
See application file for complete search history.

(56) References Cited

FOREIGN PATENT DOCUMENTS

| | | |
|---|---|---|
| CN | 101354268 | 1/2009 |
| CN | 110281896 | 9/2019 |
| KR | 101173087 | 8/2012 |
| KR | 20210012664 | 2/2021 |
| KR | 102336250 | 12/2021 |
| WO | 2017063501 | 4/2017 |

OTHER PUBLICATIONS

WIPO, International Search Report for PC/CN2022/121322, Dec. 29, 2022.

*Primary Examiner* — Hal Kaplan
(74) *Attorney, Agent, or Firm* — Hodgson Russ LLP

(57) ABSTRACT

A circuit for controlling failure of a vehicle MCU includes: a failure state detector, configured to monitor the state of a MCU circuit in real time; a maintaining voltage signal generator, configured to: when the MCU circuit is detected to be in a failure state, convert a voltage from an ignition coil of a vehicle to form a failure maintaining voltage signal; and a driving maintainer, configured to output the failure maintaining voltage signal to a driving controller of each load in the vehicle so as to maintain the normal work of the driving controller.

19 Claims, 5 Drawing Sheets

CIRCUIT, METHOD AND STORAGE MEDIUM FOR CONTROLLING FAILURE OF VEHICLE MCU

CROSS-REFERENCE TO RELATED APPLICATIONS

This application is a National Stage Application under 35 U.S.C. § 371 of International Application No. PCT/CN2022/121322, filed on Sep. 26, 2022, which claims priority to Chinese Patent Application No. 202111429662.7, filed on Nov. 29, 2021, the entire disclosures of which are incorporated herein by reference.

FIELD OF TECHNOLOGY

The present disclosure relates to the technical field of automobile electronic devices, and in particular to a circuit and method for controlling failure of a vehicle MCU.

BACKGROUND

At present, with the development of automobile technology, there are more and more functions, and the design requirements for functional failure are more and more strict. In the real vehicle environment, due to the influence of high temperature, high humidity, high voltage, electromagnetism (EMC) and the like, when a microcontroller unit (MCU) circuit cannot perform driving control on related functions after being abnormal or broken, the whole system will lose control and face paralysis; and at this time, if related safety functions are not activated, the driving safety of the automobile will be seriously affected.

SUMMARY

There are provided a circuit and method for controlling failure of a vehicle MCU. The technical solution is as below:

According to a first aspect of embodiments of the present disclosure, there is provided a circuit for controlling failure of a vehicle MCU. The circuit for controlling the failure of the vehicle MCU at least includes:
  a failure state detector, configured to monitor information output by an MCU circuit in real time to detect whether the MCU circuit is in a failure state;
  a maintaining voltage signal generator, configured to: when the MCU circuit is detected to be in a failure state, convert a voltage from an ignition coil of a vehicle to form a failure maintaining voltage signal; and
  a driving maintainer, configured to output the failure maintaining voltage signal to a driving controller of each load in the vehicle so as to maintain the normal work of the driving controller.

According to a second aspect of embodiments of the present disclosure, there is provided a method for controlling failure of a vehicle MCU. The method for controlling the failure of the vehicle MCU is implemented by the circuit, and includes the following steps:
  Step S10: monitoring information output by an MCU circuit in real time to detect whether the MCU circuit is in a failure state;
  Step S11: when the MCU circuit is detected to be in a failure state, converting a voltage from an ignition coil of a vehicle to form a failure maintaining voltage signal; and
  Step S12: outputting the failure maintaining voltage signal to a driving controller of each load in the vehicle so as to maintain the normal work of the driving controller.

According to a third aspect of the embodiment of the present disclosure, there is provided a non-transitory computer-readable storage medium storing instructions, executable by a processor in a terminal, for performing a method for controlling failure of a vehicle MCU, the method comprising:
  Step S10: monitoring information output by an MCU circuit in real time to detect whether the MCU circuit is in a failure state;
  Step S11: when the MCU circuit is detected to be in a failure state, converting a voltage from an ignition coil of a vehicle to form a failure maintaining voltage signal; and
  Step S12: outputting the failure maintaining voltage signal to a driving controller of each load in the vehicle so as to maintain the normal work of the driving controller.

BRIEF DESCRIPTION OF THE DRAWINGS

To describe the technical solutions in the embodiments of the present disclosure, the following briefly describes the accompanying drawings required for describing the embodiments. Apparently, the accompanying drawings in the following description only show some embodiments of the present disclosure. For those of ordinary skill in the art, other drawings obtained from these accompanying drawings without creative efforts should still belong to the scope of the present disclosure.

DETAILED DESCRIPTION OF THE EMBODIMENTS

To make the objectives, technical solutions, and advantages of the present disclosure clearer, the present disclosure will be further described below in detail with reference to the accompanying drawings.

Figure 1:
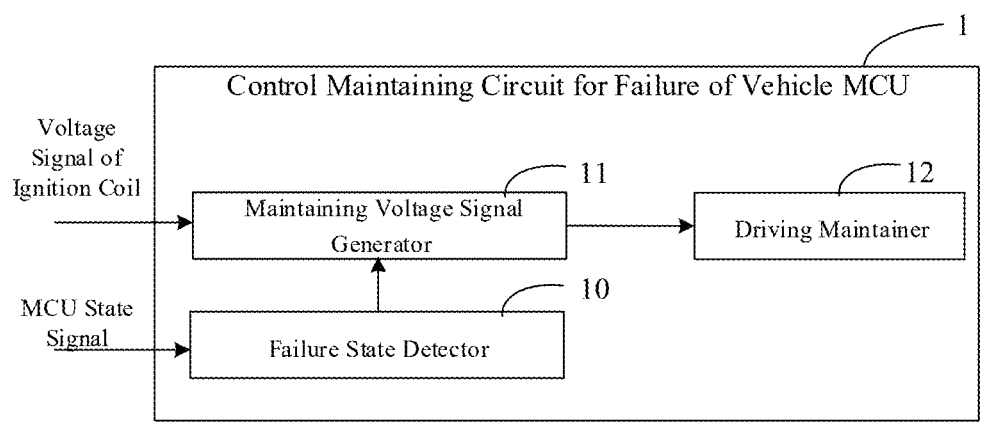
FIG. 1 is a schematic framework diagram according to an embodiment of a circuit for controlling failure of a vehicle MCU according to the present disclosure.
Figure 2:
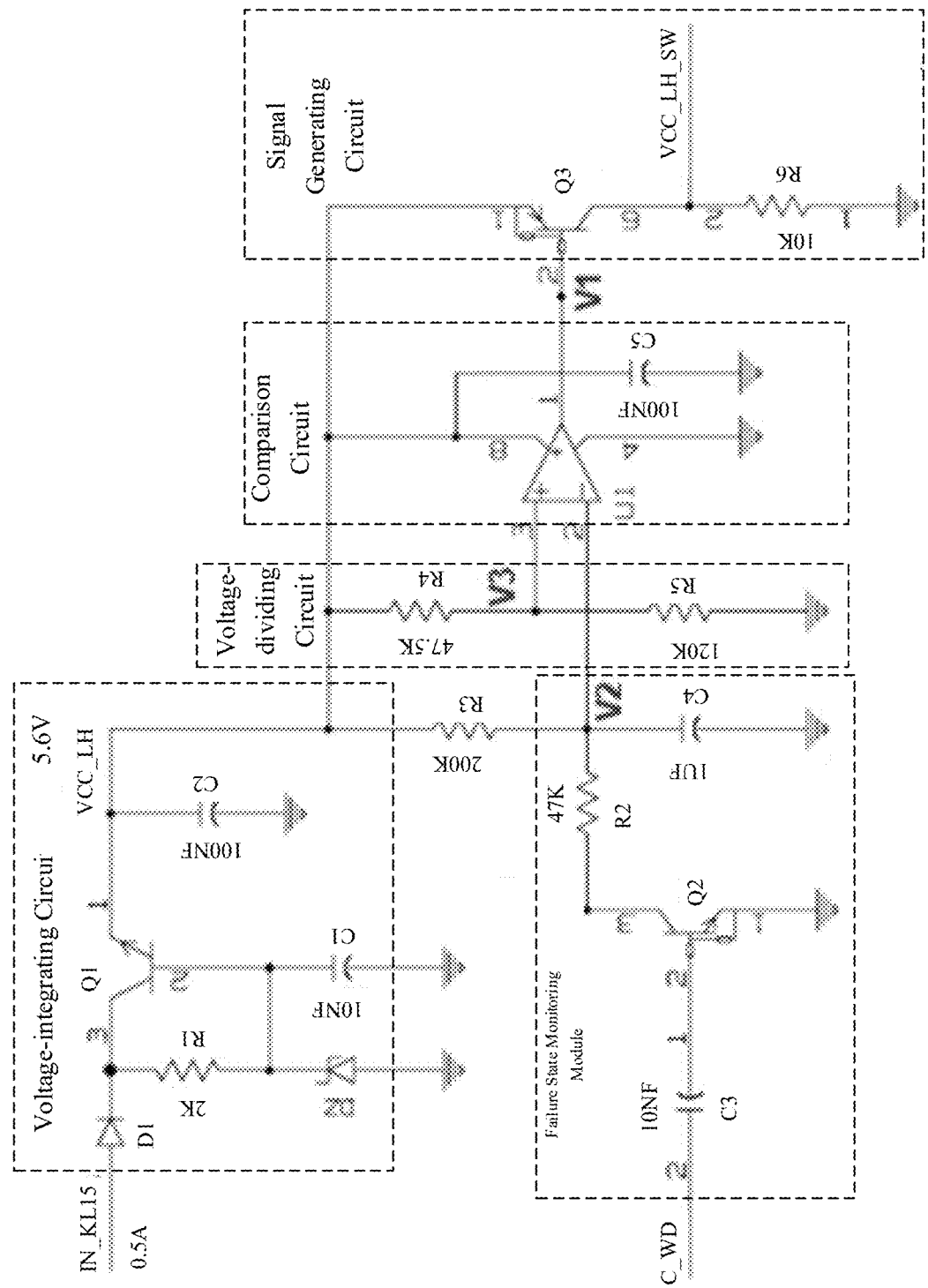
FIG. 2 is a corresponding circuit schematic diagram in FIG. 1.
Figure 3:
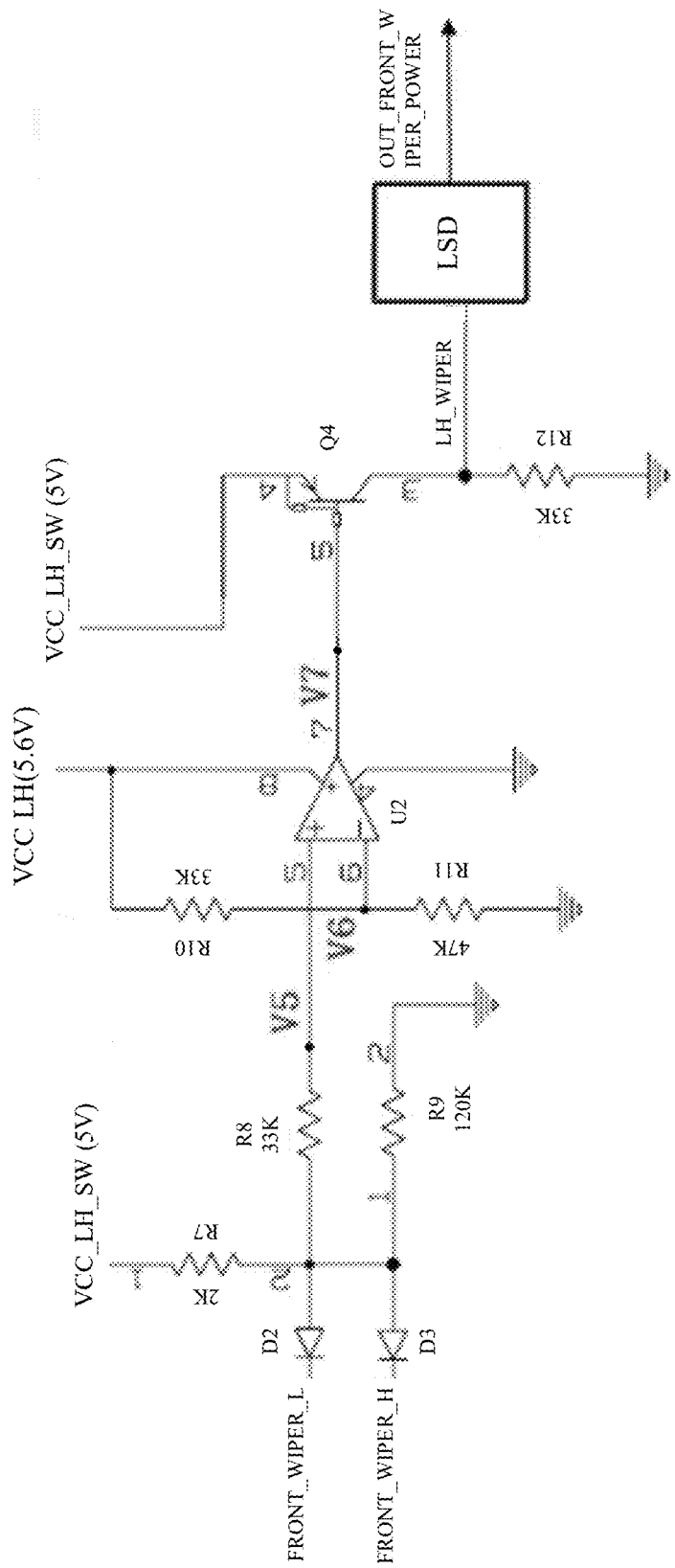
FIG. 3 is a circuit schematic diagram of controlling a windscreen wiper by a failure maintaining voltage signal according to the present disclosure.
Figure 4:
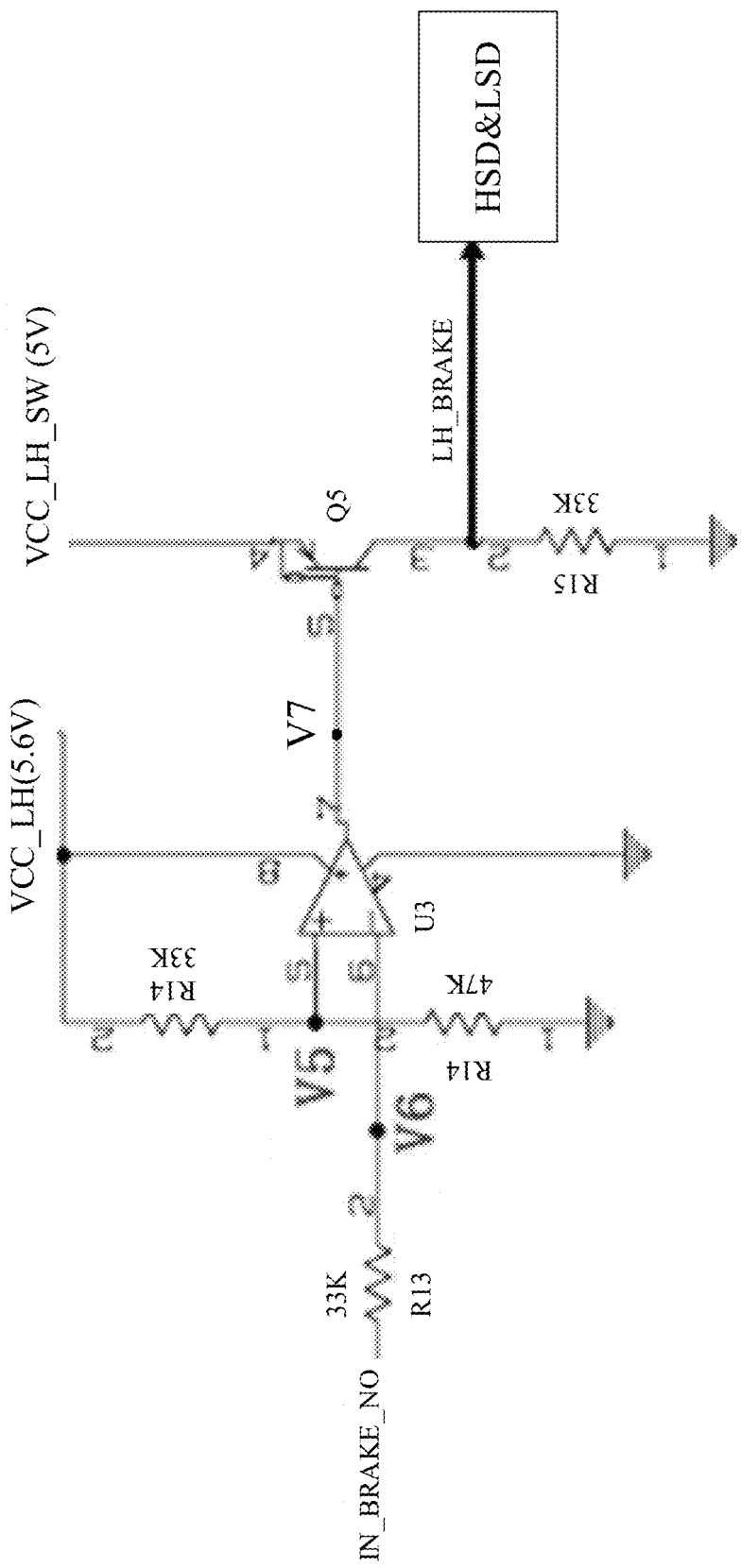
FIG. 4 is a circuit schematic diagram of controlling braking by a failure maintaining voltage signal according to the present disclosure.

As shown in FIG. 1, it shows a schematic framework diagram of an embodiment of a control maintainer for the failure of the vehicle MCU according to the present disclosure. Referring to FIG. 2 to FIG. 4, in this embodiment, the control maintainer 1 for the failure of the vehicle MCU includes:
  a failure state detector 10, configured to monitor information output by an MCU circuit in real time to detect whether the MCU circuit is in a failure state;
  a maintaining voltage signal generator 11, configured to: when the MCU circuit is detected to be in a failure state, convert a voltage from an ignition coil of a vehicle to form a failure maintaining voltage signal; and a driving maintainer 12, configured to output the failure maintaining voltage signal to a driving controller of each load in the vehicle so as to maintain the normal work of the driving controller.

Referring to FIG. 2, the maintaining voltage signal generator 11 further includes:

a voltage-integrating circuit, including: a first diode D1, where a positive electrode of the first diode D1 is connected to a voltage signal (IN_KL15 signal, GENERALLY 12 V) of the ignition coil, a negative electrode of the first diode D1 is connected to a collecting electrode of a first triode Q1, the collecting electrode of the first triode D1 is further connected to a first terminal of a first resistor R1, a base electrode of the first triode D1 is grounded through a first capacitor C1, a second terminal of the first resistor R1 is connected to the base electrode of the first triode Q1 and is grounded through a voltage-stabilizing diode DZ, an emitting electrode of the first triode Q1 outputs a first voltage signal (VCC_LH), and In one example, the first voltage signal is 5.6 V;

a voltage-dividing circuit, including: a fourth resistor R4, where a first terminal of the fourth resistor R4 is connected to the emitting electrode of the first triode Q1, and a second terminal of the fourth resistor R4 is grounded through a fifth resistor R5;

a comparison circuit, including: a comparator U1, where a positive input terminal (+) of the comparator U1 is connected to the second terminal of the fourth resistor R2, a negative input terminal (−) of the comparator U1 is connected to the emitting electrode of the first triode Q1 through a third resistor R3, a positive power supply terminal (V+) of the comparator U1 is connected to the emitting electrode of the first triode Q1 and is grounded through a fifth capacitor C5, a negative power supply terminal (V−) of the comparator is grounded, and in one example, the model of the comparator U1 is LM2903; and a signal generator, including: a first amplifier Q3, where an emitting electrode of the first amplifier Q3 is connected to the emitting electrode of the first triode Q1, a base electrode of the first amplifier Q3 is connected to an output terminal of the comparator U1, and a collecting electrode of the first amplifier Q3 is grounded through a sixth resistor R6 and outputs a second voltage signal (VCC_LH_SW).

The failure state detector 10 further includes:

a third capacitor C3, where a first terminal of the third capacitor C3 receives a state signal (C_WD) from the MCU circuit, a state signal output by the MCU circuit is a PWM signal with a predetermined frequency (such as a PWM signal with the frequency being 200 HZ and a duty ratio being 20%) when the MCU circuit is in a normal state, and a state signal output by the MCU circuit is a non-PWM level signal) such as a 0V or 5V level signal) when the MCU circuit is in a failure state; and a second amplifier Q2, where abase electrode of the second amplifier Q2 is connected to a second terminal of the third capacitor C3, an emitting electrode of the second amplifier Q2 is grounded, a collecting electrode of the second amplifier Q2 is connected to a first terminal of the second resistor, and a second terminal of the second resistor R2 is grounded through a fourth capacitor C4 and is connected to the negative input terminal (−) of the comparator U2.

When the MCU circuit is abnormal or broken, that is, in a failure state, the output state signal (C_WD) is a non-PWM level signal, and at this time, the voltage may be 0 V or 5 V, and there is not PWM waveform; at this time, a collecting electrode of a second triode Q2 is in a suspended (high-resistance) state, a second terminal (that is, a point V2 in the figure) of the second resistor R2 is at a high potential (5.6V), a voltage V3 at a positive input terminal of the comparator U1 is a voltage (5.6*120/(120+47.5)=4.01V) after voltage division and is less than a voltage (5.6 V) at a negative input terminal V2, and the output terminal outputs a low level; therefore, the first amplifier Q3 is in an on state, a second voltage signal output by the collecting electrode of the first amplifier Q3 is a failure maintaining voltage signal, and at this time, the failure maintaining voltage signal VCC_LH_SW=VCC_LH-Vpn=5.6−0.6=5V, where Vpn is an on voltage of the first amplifier Q3.

When the MCU circuit is in a normal state, the state signal output by the MCU circuit is a PWM signal with a predetermined frequency, for example, may be PWM with the frequency being 200 HZ and a duty ratio being 20%. The PWM signal may control the first triode Q to be continuously in an on-off-on state so as to charge and discharge an RC circuit formed by the second resistor R2 and the fourth capacitor C4, so that a second terminal (that is, a point V2) of the second resistor R2 is at a low potential (about 0.7 V), the voltage at the positive input terminal of the comparator U1 (4.01 V obtained after voltage division) is greater than the voltage at the negative input terminal, the output terminal outputs a low potential, the first amplifier Q3 is in an cut-off state, and a second voltage signal VCC_LH_SW output by the collecting electrode of the first amplifier Q3 is a low level (OV).

As shown in FIG. 3 and FIG. 4, they respectively show schematic diagrams of maintaining the state of a load controller by the failure maintaining voltage signal, that is, 5V VCC_LH_SW in the present disclosure.

More specifically, as shown in FIG. 3, when the MCU circuit is in the failure state, the failure control maintaining function provided by the present disclosure is activated, VCC_LH_SW=5V; and if a low-speed windscreen wiper FRONT_WIPER_L and a high-speed windscreen wiper FRONT_WIPER_H are not operated and pressed, two signals are suspended. The voltage of a point V5 is 5 V, the voltage of a point V6 is: 5.6*47/(47+33)=3.3V, the voltage at the point V5 is greater than the voltage at the point V6, and a comparator U2 outputs a high potential. At this time, the voltage at a point V7 is 5.6 V, a triode Q4 is cut off, a windscreen wiper control signal LH_Wiper is 0 V, and an input signal input to a low-terminal driving chip is invalid.

If any one of the windscreen wipers FRONT_WIPER_L and FRONT_WIPER_H is operated and pressed, the voltage at the point V5 is changed to 0 V, the voltage at the point V6 is 3.3 V, the voltage at the point V5 is less than the voltage at the point V6, the comparator U2 outputs a low level, and at this time the voltage at the point V7 is 0 V; therefore, the triode Q4 is turned on, the windscreen wiper control signal LH_Wiper is 5V, an input signal input to the low-terminal driving chip is valid, the output valid value of OUT_FRONT_WIPER_POWER is 0 V, and the windscreen wiper can be controlled to start working.

Similarly, in FIG. 4, when the MCU circuit is in the failure state, the failure control maintaining function provided by the present disclosure is activated, VCC_LH_SW=5V. If a brake is not stepped on, a brake input signal IN_BRAK- E_NO is 0 V, the voltage at the point V6 is 0 V and the voltage of the point V2 is: 5.6*47/(47+33)=3.3V, the voltage at the point V6 is less than the voltage at the point V5, a comparator U3 outputs a high potential, that is, the voltage at the point V7 is 5.6 V, so the triode Q5 is cut off, a brake light control signal LH_BRAKE is 0 V, and a control signal of a driving chip is invalid.

If the brake is stepped on, the brake input signal IN_BRAKE_NO is 12 v, the voltage at the point V6 is 12 V, the voltage at the point V2 is: 5.6*47/(47+33)=3.3V, the voltage at the point V6 is greater than the voltage at the point V5, the comparator U3 outputs a low potential, the voltage at the point V7 is 0 V, the triode Q5 is conducted, the brake light control signal LH_BRAKE is 5 V, the control signal of the driving chip is valid, and LSD&HSD (left and right brake apparatuses) can be directly driven.

It may be understood that after the failure of the MCU circuit, a similar circuit is used for maintaining control of the controller for other loads through the failure maintaining voltage signal.

Figure 5:
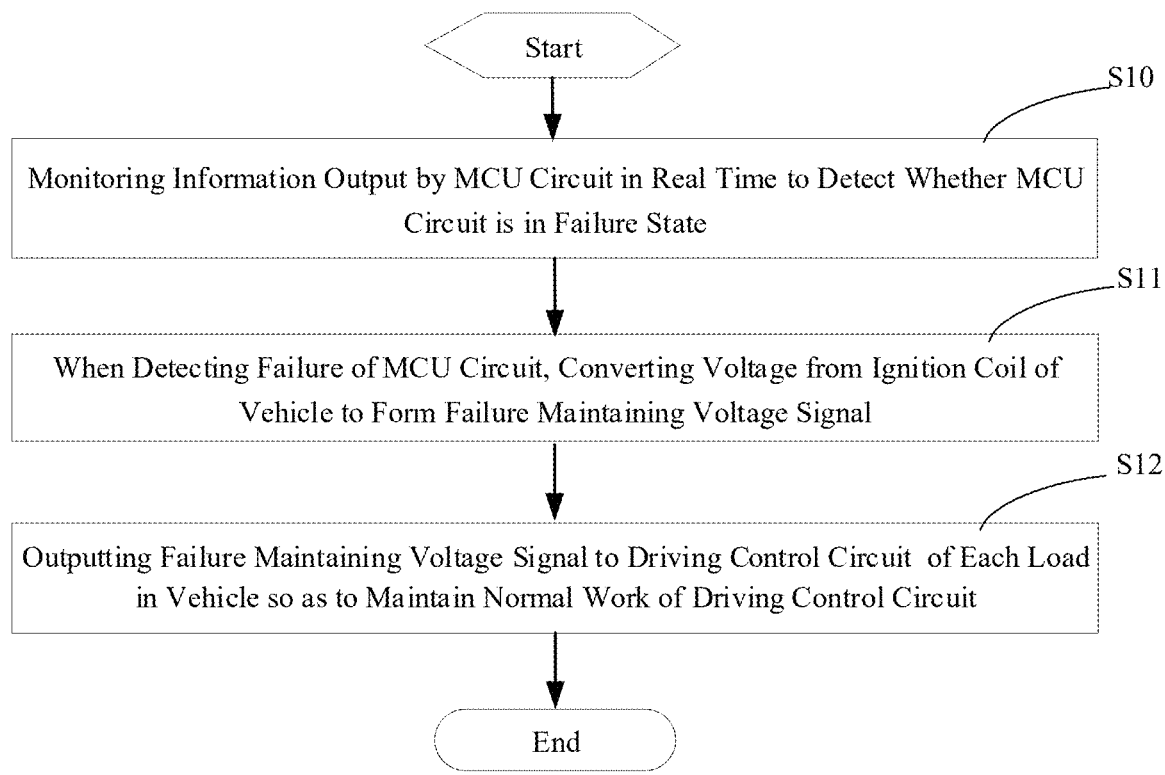
FIG. 5 is a main flow schematic diagram of an embodiment of a circuit for controlling failure of a vehicle MCU according to the present disclosure.

Correspondingly, according to another aspect of the present disclosure, a control maintaining method for failure of a vehicle MCU is further provided. The method is implemented by the above circuit and includes the following steps shown in FIG. 5:

Step S10: information output by an MCU circuit is monitored in real time to detect whether the MCU circuit is in a failure state;

Step S11: when the failure of the MCU circuit is detected, a voltage from an ignition coil of a vehicle is converted to form a failure maintaining voltage signal; and Step S12: the failure maintaining voltage signal is output to a driving controller of each load in the vehicle so as to maintain the normal work of the driving controller.

Step S10 further includes:
a state signal output by the MCU circuit is detected in real time;
when the state signal is a first type signal, it is determined that the MCU circuit is in a normal state; and when the state signal is a second type signal, it is determined that the MCU circuit is in a failure state,
where the first type signal is a PWM signal with a predetermined frequency, and the second type signal is a non-PWM level signal.

Step S11 further includes:
12V voltage from the ignition coil of the vehicle is integrated to a first voltage signal, and the voltage is input to the positive input terminal of the comparator after voltage division;
when the MCU circuit is detected to be in the failure state, controlling the first voltage to the negative input terminal of the comparator so as to make the comparator output a low level to a base electrode of the triode, where an emitting electrode of the triode receives the first voltage signal, and
allowing the triode to be in an on state after receiving the low potential from the comparator at the base electrode, and outputting a second voltage signal at the collecting electrode to take the second voltage signal as a failure maintaining voltage signal.

The method for controlling the failure of the vehicle MCU further includes:
when the MCU circuit is detected to be in a normal state, controlling to input a low level to the negative input terminal of the comparator, so that the comparator outputs a high level to the base electrode of the triode to cut off the triode and to output a low level at a collecting electrode of the triode.

More details may be referenced to the description of FIG. 1 to FIG. 4, which will not be elaborated here.

The embodiments of the present disclosure have the following beneficial effects:
the present disclosure provides the control maintainer and method for the failure of the vehicle MCU; the state of the MCU circuit can be monitored in real time by setting the failure state detector, the maintaining voltage signal generator and the driving maintainer; when the failure of the MCU circuit is detected, the voltage from the ignition coil of the vehicle is converted to form the failure maintaining voltage signal; and the failure maintaining voltage signal is output to the driving controller of each load in the vehicle to maintain the normal work of the driving controller. It can ensure that after the failure of the MCU circuit, various functions still can be driven normally through hardware of the circuit. By adoption of the solution of the present disclosure, even after the failure of the MCU, the power supply maintaining, headlamp, windscreen wiper, door lock and other functions of the whole vehicle will not be affected and can continue to be used, so that the safety of a vehicle circuit and the safety in the driving process can be improved.

A person skilled in the art should understand that the embodiments of the present disclosure may be provided as a method, an apparatus, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, CD-ROM, an optical memory, and the like) that include computer-usable program code.

The present disclosure is described with reference to the flowcharts and/or block diagrams of the methods, devices (systems), and computer program products according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided to a processor of a general-purpose computer, a dedicated computer, an embedded processor, or another programmable data processing device to produce a machine, so that instructions executed by a processor of a computer or another programmable data processing device produce an apparatus for implementing a function specified in one or more processes of the flowchart and/or one or more blocks of the block diagram.

The above is only a preferred embodiment of the present disclosure, which certainly cannot be used to limit the scope of the claims of the present disclosure. Therefore, an equivalent change made according to the claims of the present disclosure should still be included in the scope of the present disclosure.

The invention claimed is:
1. A circuit for controlling failure of a vehicle MCU, at least comprising:
a failure state detector, configured to monitor information output by an MCU circuit in real time to detect whether the MCU circuit is in a failure state;

a maintaining voltage signal generator, configured to: when the MCU circuit is detected to be in a failure state, convert a voltage from an ignition coil of a vehicle to form a failure maintaining voltage signal; and a driving maintainer, configured to output the failure maintaining voltage signal to a driving controller of each load in the vehicle so as to maintain normal work of the driving controller.

2. The circuit according to claim 1, wherein the maintaining voltage signal generator further comprises:

a voltage-integrating sub-circuit, comprising a first diode, a positive electrode of the first diode being connected to a voltage signal of the ignition coil, a negative electrode of the first diode being connected to a collecting electrode of a first triode, the collecting electrode of the first triode being further connected to a first terminal of a first resistor, a base electrode of the first triode being grounded through a first capacitor, a second terminal of the first resistor being connected to the base electrode of the first triode and being grounded through a voltage-stabilizing diode, and an emitting electrode of the first triode outputting a first voltage signal;

a voltage-dividing sub-circuit, comprising a fourth resistor, a first terminal of the fourth resistor being connected to the emitting electrode of the first triode, and a second terminal of the fourth resistor being grounded through a fifth resistor;

a comparison sub-circuit, comprising a comparator, a positive input terminal of the comparator being connected to the second terminal of the fourth resistor, a negative input terminal of the comparator being connected to the emitting electrode of the first triode through a third resistor, a positive power supply terminal of the comparator being connected to the emitting electrode of the first triode and being grounded through a fifth capacitor, and a negative power supply terminal of the comparator being grounded; and a signal generating sub-circuit, comprising a first amplifier, an emitting electrode of the first amplifier being connected to the emitting electrode of the first triode, a base electrode of the first amplifier being connected to an output terminal of the comparator, and a collecting electrode of the first amplifier being grounded through a sixth resistor and outputting a second voltage signal.

3. The circuit according to claim 2, wherein the failure state detector further comprises:

a third capacitor, a first terminal of the third capacitor receiving a state signal from the MCU circuit; and a second amplifier, a base electrode of the second amplifier being connected to a second terminal of the third capacitor, an emitting electrode of the second amplifier being grounded, a collecting electrode of the second amplifier being connected to a first terminal of a second resistor, and a second terminal of the second resistor being grounded through a fourth capacitor and being connected to the negative input terminal of the comparator.

4. The circuit according to claim 3, wherein when the MCU circuit is in a normal state, a state signal output by the MCU circuit is a PWM signal with a predetermined frequency; and when the MCU circuit is in a failure state, a state signal output by the MCU circuit is a non-PWM level signal.

5. The circuit according to claim 4, wherein:

when the state signal output by the MCU circuit is the non-PWM level signal, the second terminal of the second resistor is at a high potential, a voltage at the positive input terminal of the comparator is less than a voltage at the negative input terminal of the comparator, and the output terminal of the comparator outputs a low level; the first amplifier is in an on state, and a second voltage signal output by the collecting electrode of the first amplifier is a failure maintaining voltage signal; and when the state signal output by the MCU circuit is the PWM signal with the predetermined signal, the second terminal of the second resistor is at a low potential, a voltage at the positive input terminal of the comparator is greater than a voltage at the negative input terminal of the comparator, and the output terminal of the comparator outputs a low potential; and the first amplifier is in an off state, and a second voltage signal output by the collecting electrode of the first amplifier is a low level.

6. The circuit according to claim 2, wherein the first voltage signal is 5.6 V, the failure maintaining voltage signal is 5 V, and a model of the comparator is LM2903.

7. A method for controlling failure of a vehicle MCU, being implemented by a circuit for controlling failure of a vehicle MCU comprising:

a failure state detector, configured to monitor information output by an MCU circuit in real time to detect whether the MCU circuit is in a failure state;

a maintaining voltage signal generator, configured to: when the MCU circuit is detected to be in a failure state, convert a voltage from an ignition coil of a vehicle to form a failure maintaining voltage signal; and a driving maintainer, configured to output the failure maintaining voltage signal to a driving controller of each load in the vehicle so as to maintain normal work of the driving controller;

wherein the method comprises the following steps:

Step S10: monitoring information output by the MCU circuit in real time to detect whether the MCU circuit is in a failure state;

Step S11: when the MCU circuit is detected to be in a failure state, converting a voltage from the ignition coil of the vehicle to form a failure maintaining voltage signal; and Step S12: outputting the failure maintaining voltage signal to the driving controller of each load in the vehicle so as to maintain the normal work of the driving controller.

8. The method according to claim 7, wherein Step S10 further comprises:

detecting a state signal output by the MCU circuit in real time; and when the state signal is a first type signal, determining that the MCU circuit is in a normal state; and when the state signal is a second type signal, determining that the MCU circuit is in a failure state, wherein the first type signal being a PWM signal with a predetermined frequency, and the second type signal being a non-PWM level signal.

9. The method according to claim 8, wherein Step S11 further comprises:

integrating 12V voltage from the ignition coil of the vehicle to a first voltage signal, and inputting the voltage to a positive input terminal of a comparator after voltage division;

when the MCU circuit is detected to be in the failure state, controlling to input the first voltage signal to a negative input terminal of the comparator so as to make the comparator output a low level to a base electrode of a triode, wherein an emitting electrode of the triode receiving the first voltage signal, and allowing the triode to be in an on state after receiving the low level from the comparator at the base electrode, and outputting a second voltage signal at a collecting electrode to take the second voltage signal as a failure maintaining voltage signal.

10. The method according to claim 8, further comprising:

when the MCU circuit is detected to be in a normal state, controlling to input a low level to a negative input terminal of a comparator, so that the comparator outputs a high level to a base electrode of a triode to cut off the triode and to output a low level at a collecting electrode of the triode.

11. The method according to claim 7, wherein the maintaining voltage signal generator further comprises:

a voltage-integrating sub-circuit, comprising a first diode, a positive electrode of the first diode being connected to a voltage signal of the ignition coil, a negative electrode of the first diode being connected to a collecting electrode of a first triode, the collecting electrode of the first triode being further connected to a first terminal of a first resistor, a base electrode of the first triode being grounded through a first capacitor, a second terminal of the first resistor being connected to the base electrode of the first triode and being grounded through a voltage-stabilizing diode, and an emitting electrode of the first triode outputting a first voltage signal;

a voltage-dividing sub-circuit, comprising a fourth resistor, a first terminal of the fourth resistor being connected to the emitting electrode of the first triode, and a second terminal of the fourth resistor being grounded through a fifth resistor;

a comparison sub-circuit, comprising a comparator, a positive input terminal of the comparator being connected to the second terminal of the fourth resistor, a negative input terminal of the comparator being connected to the emitting electrode of the first triode through a third resistor, a positive power supply terminal of the comparator being connected to the emitting electrode of the first triode and being grounded through a fifth capacitor, and a negative power supply terminal of the comparator being grounded; and a signal generating sub-circuit, comprising a first amplifier, an emitting electrode of the first amplifier being connected to the emitting electrode of the first triode, a base electrode of the first amplifier being connected to an output terminal of the comparator, and a collecting electrode of the first amplifier being grounded through a sixth resistor and outputting a second voltage signal.

12. The method according to claim 11, wherein the failure state detector further comprises:

a third capacitor, a first terminal of the third capacitor receiving a state signal from the MCU circuit; and a second amplifier, a base electrode of the second amplifier being connected to a second terminal of the third capacitor, an emitting electrode of the second amplifier being grounded, a collecting electrode of the second amplifier being connected to a first terminal of a second resistor, and a second terminal of the second resistor being grounded through a fourth capacitor and being connected to the negative input terminal of the comparator.

13. The method according to claim 12, wherein when the MCU circuit is in a normal state, a state signal output by the MCU circuit is a PWM signal with a predetermined frequency; and when the MCU circuit is in a failure state, a state signal output by the MCU circuit is a non-PWM level signal.

14. The method according to claim 13, wherein:

when the state signal output by the MCU circuit is the non-PWM level signal, the second terminal of the second resistor is at a high potential, a voltage at the positive input terminal of the comparator is less than a voltage at the negative input terminal of the comparator, and the output terminal of the comparator outputs a low level; the first amplifier is in an on state, and a second voltage signal output by the collecting electrode of the first amplifier is a failure maintaining voltage signal; and when the state signal output by the MCU circuit is the PWM signal with the predetermined signal, the second terminal of the second resistor is at a low potential, a voltage at the positive input terminal of the comparator is greater than a voltage at the negative input terminal of the comparator, and the output terminal of the comparator outputs a low potential; and the first amplifier is in an off state, and a second voltage signal output by the collecting electrode of the first amplifier is a low level.

15. The method according to claim 11, wherein the first voltage signal is 5.6 V, the failure maintaining voltage signal is 5 V, and a model of the comparator is LM2903.

16. A non-transitory computer-readable storage medium having stored therein instructions that, when executed by a processor of a terminal, causes the terminal to perform a method for controlling failure of a vehicle MCU, the method comprising:

Step S10: monitoring information output by an MCU circuit in real time to detect whether the MCU circuit is in a failure state;

Step S11: when the MCU circuit is detected to be in a failure state, converting a voltage from an ignition coil of a vehicle to form a failure maintaining voltage signal; and Step S12: outputting the failure maintaining voltage signal to a driving controller of each load in the vehicle so as to maintain normal work of the driving controller.

17. The method according to claim 16, wherein Step S10 further comprises:

detecting a state signal output by the MCU circuit in real time; and when the state signal is a first type signal, determining that the MCU circuit is in a normal state; and when the state signal is a second type signal, determining that the MCU circuit is in a failure state, wherein the first type signal being a PWM signal with a predetermined frequency, and the second type signal being a non-PWM level signal.

18. The method according to claim 17, wherein Step S11 further comprises:

integrating 12V voltage from the ignition coil of the vehicle to a first voltage signal, and inputting the voltage to a positive input terminal of a comparator after voltage division;

when the MCU circuit is detected to be in the failure state,
controlling to input the first voltage signal to a negative input terminal of the comparator so as to make the comparator output a low level to a base electrode of a triode, wherein an emitting electrode of the triode receiving the first voltage signal, and allowing the triode to be in an on state after receiving the low level from the comparator at the base electrode, and outputting a second voltage signal at a collecting electrode to take the second voltage signal as a failure maintaining voltage signal.

19. The method according to claim 17, further comprising:

when the MCU circuit is detected to be in a normal state, controlling to input a low level to a negative input terminal of a comparator, so that the comparator outputs a high level to a base electrode of a triode to cut off the triode and to output a low level at a collecting electrode of the triode.

* * * * *